United States Patent
McLaughlin

(10) Patent No.: US 12,237,865 B2
(45) Date of Patent: Feb. 25, 2025

(54) ULTRA-WIDEBAND METHOD AND APPARATUS

(71) Applicant: DECAWAVE, LTD., Dublin (IE)

(72) Inventor: Michael McLaughlin, Dublin (IE)

(73) Assignee: DecaWave, Ltd., Dublin (IE)

( * ) Notice: Subject to any disclaimer, the term of this patent is extended or adjusted under 35 U.S.C. 154(b) by 0 days.

(21) Appl. No.: 18/434,089

(22) Filed: Feb. 6, 2024

(65) Prior Publication Data
US 2024/0223237 A1 Jul. 4, 2024

Related U.S. Application Data

(63) Continuation of application No. 17/590,582, filed on Feb. 1, 2022, now Pat. No. 11,936,420, which is a continuation of application No. 16/789,180, filed on Feb. 12, 2020, now Pat. No. 11,239,882.

(60) Provisional application No. 62/804,723, filed on Feb. 12, 2019.

(51) Int. Cl.
| | |
|---|---|
| *H04B 1/71* | (2011.01) |
| *H03M 13/41* | (2006.01) |
| *H04B 1/38* | (2015.01) |
| *H04B 1/717* | (2011.01) |

(52) U.S. Cl.
CPC .......... *H04B 1/7174* (2013.01); *H03M 13/41* (2013.01); *H04B 1/38* (2013.01)

(58) Field of Classification Search
CPC ...... H04B 1/7174; H04B 1/38; H04B 1/7176; H03M 13/14; H03M 13/41; H03M 13/23
See application file for complete search history.

(56) References Cited

U.S. PATENT DOCUMENTS

| | | | |
|---|---|---|---|
| 7,636,397 B2 | 12/2009 | McLaughlin | |
| 7,853,859 B2 * | 12/2010 | Ojard | H03M 13/6375 |
| | | | 714/790 |
| 8,358,709 B2 | 1/2013 | McLaughlin | |
| 8,437,432 B2 | 5/2013 | McLaughlin et al. | |
| 10,291,436 B2 * | 5/2019 | Dutz | H04L 1/0059 |
| 11,239,882 B2 | 2/2022 | McLaughlin | |
| 11,936,420 B2 | 3/2024 | McLaughlin | |
| 2007/0205921 A1 * | 9/2007 | Sawitzki | H03M 13/395 |
| | | | 341/50 |
| 2009/0262700 A1 | 10/2009 | Franceschini et al. | |
| 2011/0129032 A1 | 6/2011 | Batra et al. | |
| 2014/0269843 A1 | 9/2014 | Schaffner | |

(Continued)

OTHER PUBLICATIONS

Author Unknown, "Amendment 1: Enhanced Ultra Wideband (UWB) Physical Layers (PHYs) and Associated Ranging Techniques," IEEE Standard for Low-Rate Wireless Networks, 802.15.4z, Jun. 2020, 174 pages.

(Continued)

*Primary Examiner* — Dac V Ha
(74) *Attorney, Agent, or Firm* — Withrow & Terranova, P.L.L.C.

(57) ABSTRACT

An ultra-wideband (UWB) communication system comprising a transmitter and a receiver is disclosed. In one embodiment, a symbol mapper circuit in the transmitter is adapted, in a first mode, to develop symbols having the number of pulses as currently defined in the 4z Standard; and, in a second mode, to develop symbols having fewer pulses than as currently defined in the 4z Standard. In an optional third mode, each data bit is mapped to a single pulse.

16 Claims, 4 Drawing Sheets

(56) References Cited

U.S. PATENT DOCUMENTS

2018/0254925 A1 9/2018 Dutz et al.
2022/0368371 A1* 11/2022 McLaughlin ........ H04B 1/7174

OTHER PUBLICATIONS

Fisher, Reed, et al., "DS-UWB Physical Layer Submission to 802.15 Task Group 3a," Jan. 2005, IEEE P802.15 Working Group for Wireless personal Area Network, pp. 1-46.

Khan, Waqas Ali, et al., "High Level Modeling of an Ultra Wide-Band Baseband Transmitter in MATLAB," International Conference on Emerging Technologies, 2009, pp. 194-199.

Verso, Billy, et al., "HRP UWB PHY enhanced mode converged consensus," IEEE P802.15 Working Group for Wireless Personal Area Networks (WPANs), Nov. 2018, 11 pages.

Non-Final Office Action for U.S. Appl. No. 16/789,180, mailed Feb. 4, 2021, 7 pages.

Quayle Action for U.S. Appl. No. 16/789,180, mailed Jul. 6, 2021, 6 pages.

Notice of Allowance for U.S. Appl. No. 16/789,180, mailed Sep. 7, 2021, 8 pages.

Non-Final Office Action for U.S. Appl. No. 17/590,582, mailed Apr. 24, 2023, 9 pages.

Notice of Allowance for U.S. Appl. No. 17/590,582, mailed Nov. 13, 2023, 7 pages.

* cited by examiner

AWGN Performance

Multipath Performance

ULTRA-WIDEBAND METHOD AND APPARATUS

RELATED APPLICATIONS

This application is a continuation of U.S. patent application Publication Ser. No. 17/590,582, filed Feb. 1, 2022, now U.S. Pat. No. 11,936,420, which is a continuation of U.S. patent application Publication Ser. No. 16/789,180, filed Feb. 12, 2020, now U.S. Pat. No. 11,239,882, which claims the benefit of provisional patent application Ser. No. 62/804,723, filed Feb. 12, 2019, the disclosures of which are hereby incorporated herein by reference in their entirety.

FIELD OF THE DISCLOSURE

The present invention relates generally to ultra-wideband communication systems, and, in particular, to an improved, packet-based ultra-wideband method and apparatus having a higher data transmission rate.

BACKGROUND

In general, in the descriptions that follow, I will italicize the first occurrence of each special term of art which should be familiar to those skilled in the art of ultra-wideband ("UWB") communication systems. In addition, when I first introduce a term that I believe to be new or that I will use in a context that I believe to be new, I will bold the term and provide the definition that I intend to apply to that term. In addition, throughout this description, I will sometimes use the terms assert and negate when referring to the rendering of a signal, signal flag, status bit, or similar apparatus into its logically true or logically false state, respectively, and the term toggle to indicate the logical inversion of a signal from one logical state to the other. Alternatively, I may refer to the mutually exclusive boolean states as logic_0 and logic_1. Of course, as is well known, consistent system operation can be obtained by reversing the logic sense of all such signals, such that signals described herein as logically true become logically false and vice versa. Furthermore, it is of no relevance in such systems which specific voltage levels are selected to represent each of the logic states.

In accordance with the 4z Standard, data to be transmitted are first encoded into a stream of symbols. A systematic convolutional encoder then convolutionally encodes the bits comprising each symbol. See, e.g., FIG. 2 and FIG. 3. A symbol mapper then maps each coded bit into a frame comprising a selected number of chips. Each chip comprises either a pulse of energy or a chip-period of silence. In accordance with the frame, pulses are grouped to form bursts, with each burst being followed by a guard interval comprising one or more silent periods. See, Second Related Article. In accordance with this scheme, the data transmission rate for a given mode is related to the total number of chips in the frame and the time duration of each chip. Specifically, a symbol is transmitted within a symbol frame $T_{dsym}$, where the symbol frame $T_{dsym}$ includes a number of burst periods $T_{burst}$, each of which is followed by a Guard Interval. Each one of the burst periods $T_{burst}$ and each one of the Guard Intervals includes the same number of chip periods $T_{chip}$. For example, each burst period $T_{burst}$ and each Guard Interval may include four chip periods $T_{chip}$, however, the 4z standard also details situations in which more chip periods $T_{chip}$ are included in each burst period $T_{burst}$ and each Guard Interval. In the burst periods $T_{burst}$, a pulse is either sent or skipped in each chip period $T_{chip}$, where a sent pulse corresponds to a one and a skipped pulse corresponds to a zero. No pulses are sent during each Guard Interval, which follows each burst period $T_{burst}$. The pulses sent during each burst period $T_{burst}$ are determined by the symbol mapper. Table 1 shows an exemplary mapping of convolutionally encoded bits from the convolutional encoder shown in FIG. 2 to the pulses sent in each burst frame $T_{burst}$.

TABLE 1

| $G_0$ | $G_1$ | First burst | Second burst |
|---|---|---|---|
| 0 | 0 | 0000 | 0000 |
| 1 | 0 | 1111 | 0000 |
| 0 | 1 | 0000 | 1111 |
| 1 | 1 | 1111 | 1111 |

As shown in Table 1, for every 2 bits of encoded data ($G_0$ and $G_1$), eight active chip periods $T_{chip}$ (chip periods within burst frames $T_{burst}$) are used and eight inactive chip periods $T_{chip}$ (chip periods within Guard Intervals) are used, for a total of sixteen chip periods $T_{chip}$ within the symbol frame $T_{dsym}$. As discussed above, the data transmission rate is based on the number of chip periods $T_{chip}$ in the symbol frame $T_{dsym}$ and the time duration of each of the chip periods $T_{chip}$.

In coding theory, puncturing is the process of removing some of the parity bits after encoding with an error-correction code, see, e.g., the First Related Article. It has recently been proposed to apply this process to a standard K=7 convolutional encoder to increase the effective bit rate from 55 Mbps to 31.2 Mbps. A similar puncturing scheme could be used with the K=3 convolutional encoder to get a 48 Mbps mode. Although puncturing does increase the bit rate, the resulting loss in coding gain is large.

What is needed is an improved method and apparatus for use in a UWB communication system for a higher data transmission rate. In particular, I submit that such a method and apparatus should provide performance generally comparable to the best prior art techniques but more efficiently than known implementations of such prior art techniques.

SUMMARY

In accordance with one embodiment of my invention, I provide a method for transmitting data at much faster rates than currently defined in the 4z Standard.

In one other embodiment, I provide an UWB communication system comprising a symbol mapper configured to perform my method.

The methods of my invention may be embodied in non-transitory computer readable code on a suitable computer readable medium such that when a processor executes the computer readable code, the processor executes the respective method.

BRIEF DESCRIPTION OF THE DRAWING FIGURES

My invention may be more fully understood by a description of certain preferred embodiments in conjunction with the attached drawings in which.

Figure 1:
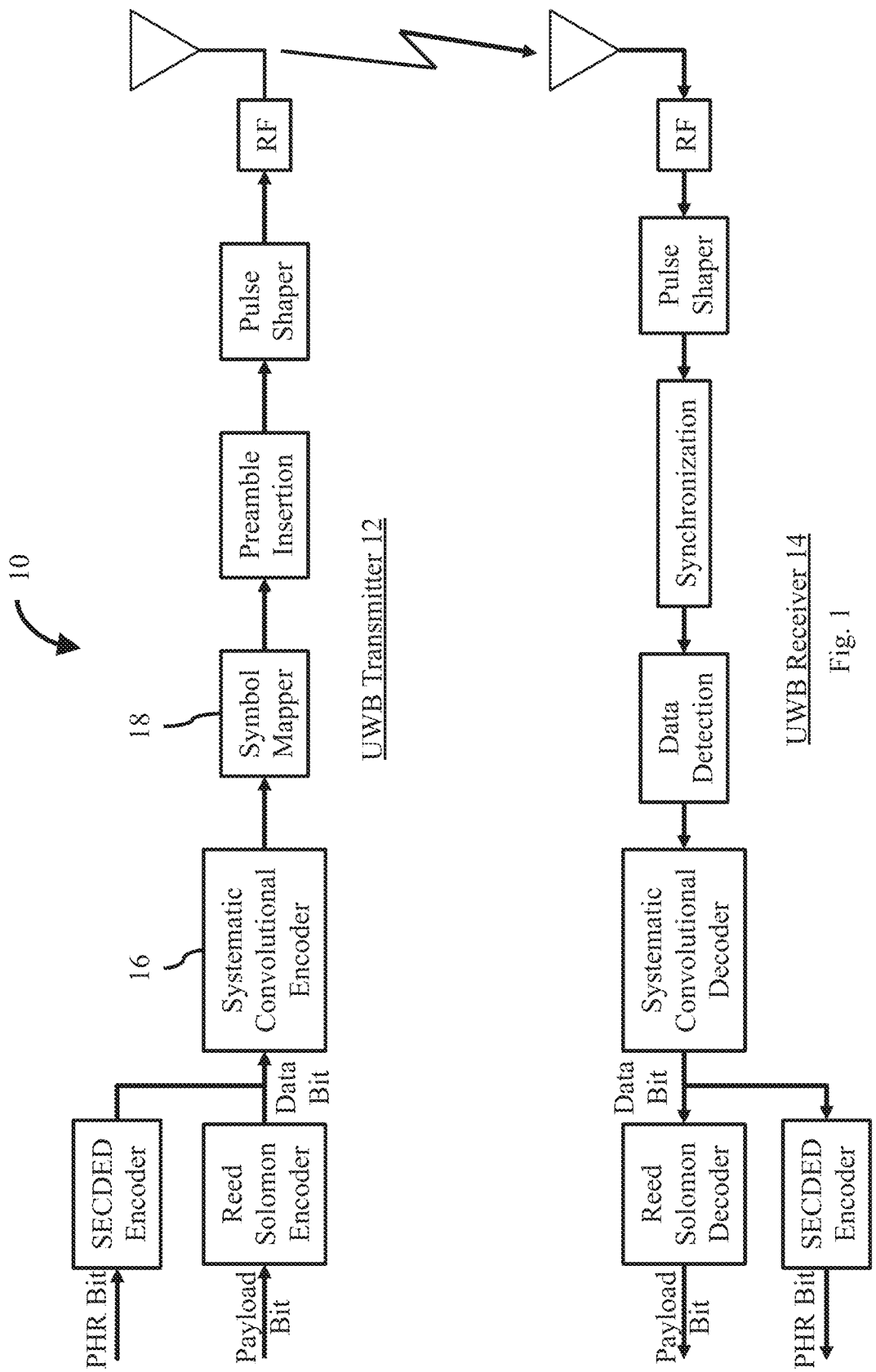
FIG. 1 illustrates, in block diagram form, a UWB communication system adapted to practice my method.

In the drawings, similar elements will be similarly numbered whenever possible. However, this practice is simply for convenience of reference and to avoid unnecessary proliferation of numbers, and is not intended to imply or suggest that my invention requires identity in either function or structure in the several embodiments.

DETAILED DESCRIPTION

Figure 4:
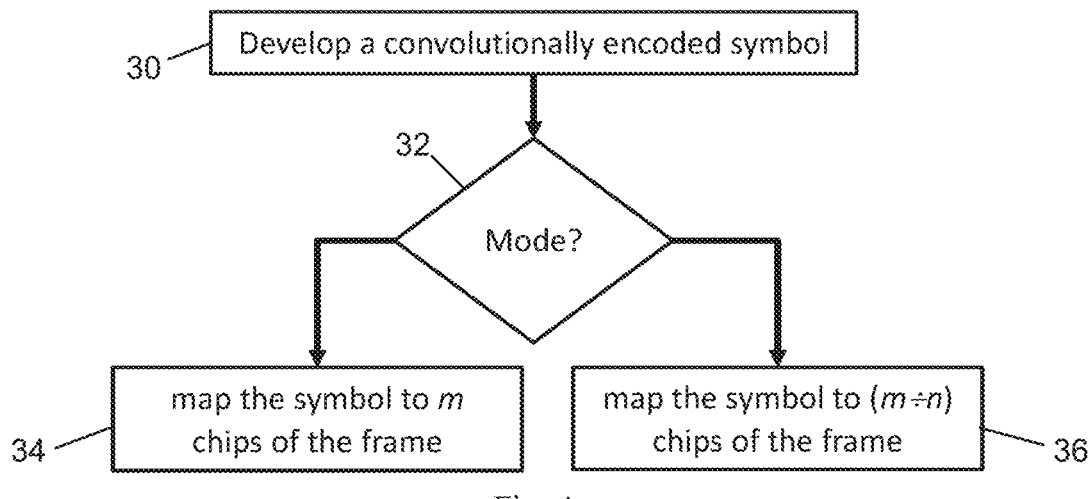
FIG. 4 illustrates, in flow diagram form, one embodiment of my method.

Illustrated in FIG. 1 is a UWB communication system 10 comprising a UWB transmitter 12 and a UWB receiver 14. In the system 10, n data bits are received for transmission: wherein n is a selected power of 2 greater than 1 and less than or equal to m; and wherein m is greater than 1. For each data bit, a respective symbol is developed by a conventional systematic convolutional encoder 16. In a first mode of operation, my improved symbol mapper 18 is configured to map each symbol to m pulses of a packet. See, e.g., 4z Standard. In a second mode of operation, my improved symbol mapper 18 is configured to map each symbol to (m+n) pulses of the packet. In one embodiment, I select n from the sequence [2, 4, 8], but those skilled in this art will recognize that other powers are possible. FIG. 4 is a flowchart outlining steps of a method according to one embodiment. Referring to block 30, a first step includes developing a convolutionally encoded symbol. Decision block 32 includes selection of a first mode of operation according to block 34 or a second mode of operation according to block 36. Block 34, corresponding to the first mode of operation, includes mapping each symbol to m chips of the frame. Block 36, corresponding to the second mode of operation, includes mapping each symbol to m+n chips of the frame.

Figure 2:
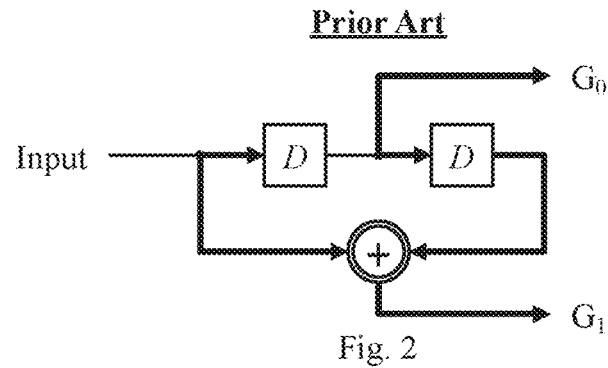
FIG. 2 illustrates, in block diagram form, the K=3 systematic convolutional encoder set forth in the 4z Standard.

By way of example, let us first consider the following examples in which n is selected to be 2:

Using the 4z Standard K=3 encoder ("K3_Reference", FIG. 2) to develop symbols at a rate of 27.2 Mbps, my symbol mapper 18 is configured to: map G0 to 4 pulses; insert 4 silent chips; map G1 to 4 pulses; and insert 4 additional silent chips.

Using the K3_Reference to develop symbols at a rate of 54.5 Mbps, my symbol mapper 18 is configured to: map G0 to only 2 pulses; map G1 to only 2 pulses; and insert 4 silent chips.

Figure 3:
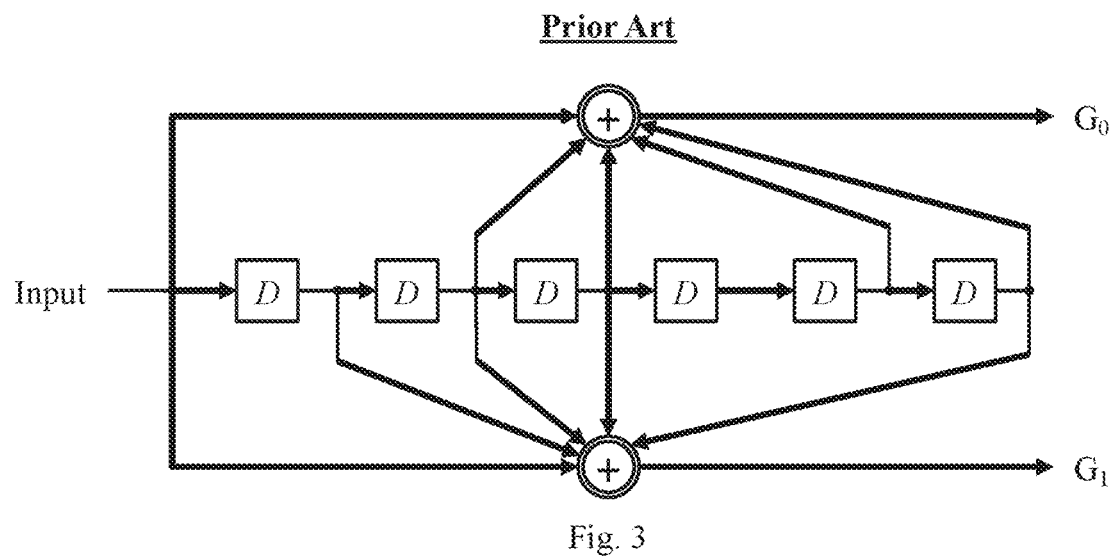
FIG. 3 illustrates, in block diagram form, the K=7 systematic convolutional encoder set forth in the 4z Standard.

Using the 4z Standard K=7 encoder ("K7_Reference", FIG. 3) to develop symbols at a rate of 31.2 Mbps, my symbol mapper 18 is configured to: map G0 to 4 pulses; insert 4 silent chips; map G1 to 4 pulses; and insert 4 additional silent chips.

Using the K7_Reference to develop symbols at a rate of 62.4 Mbps, my symbol mapper 18 is configured to: map G0 to only 2 pulses; map G1 to only 2 pulses; and insert 4 silent chips.

Now, let us consider the following examples in which n is selected to be 4:

Using the K3_Reference to develop symbols at a rate of 27.2 Mbps, my symbol mapper 18 is configured to: map G0 to only 1 pulse; map G1 to only 1 pulse; and insert only 2 silent chips. The resulting symbol rate will be 109 Mbps.

Using the K7_Reference to develop symbols at a rate of 31.2 Mbps, my symbol mapper 18 is configured to: map G0 to only 1 pulse; map G1 to only 1 pulse; and insert only 2 silent chips. The resulting symbol rate will be 125 Mbps.

Let us now consider the following examples in which n is selected to be 8:

Using the K3_Reference to develop symbols at a rate of 27.2 Mbps, my symbol mapper 18 is configured to: map G0 to only 1 pulse; map G1 to only 1 pulse; and insert no silent chips. The resulting symbol rate will be 218 Mbps.

Using the K7_Reference to develop symbols at a rate of 31.2 Mbps, my symbol mapper 18 is configured to: map G0 to only 1 pulse; map G1 to only 1 pulse; and insert no silent chips. The resulting symbol rate will be 250 Mbps.

Finally, let us consider the following example in which n is selected to be 8, and I configure my transmitter 12 so as, selectively, to bypass the convolutional encoder 16:

By bypassing both the K3_Reference and the K7_Reference, my symbol mapper 18 can easily be configured to map an input data bit, DO, to only 1 pulse, with no silent chips; the resulting symbol rate will be 436 Mbps.

Figure 5:
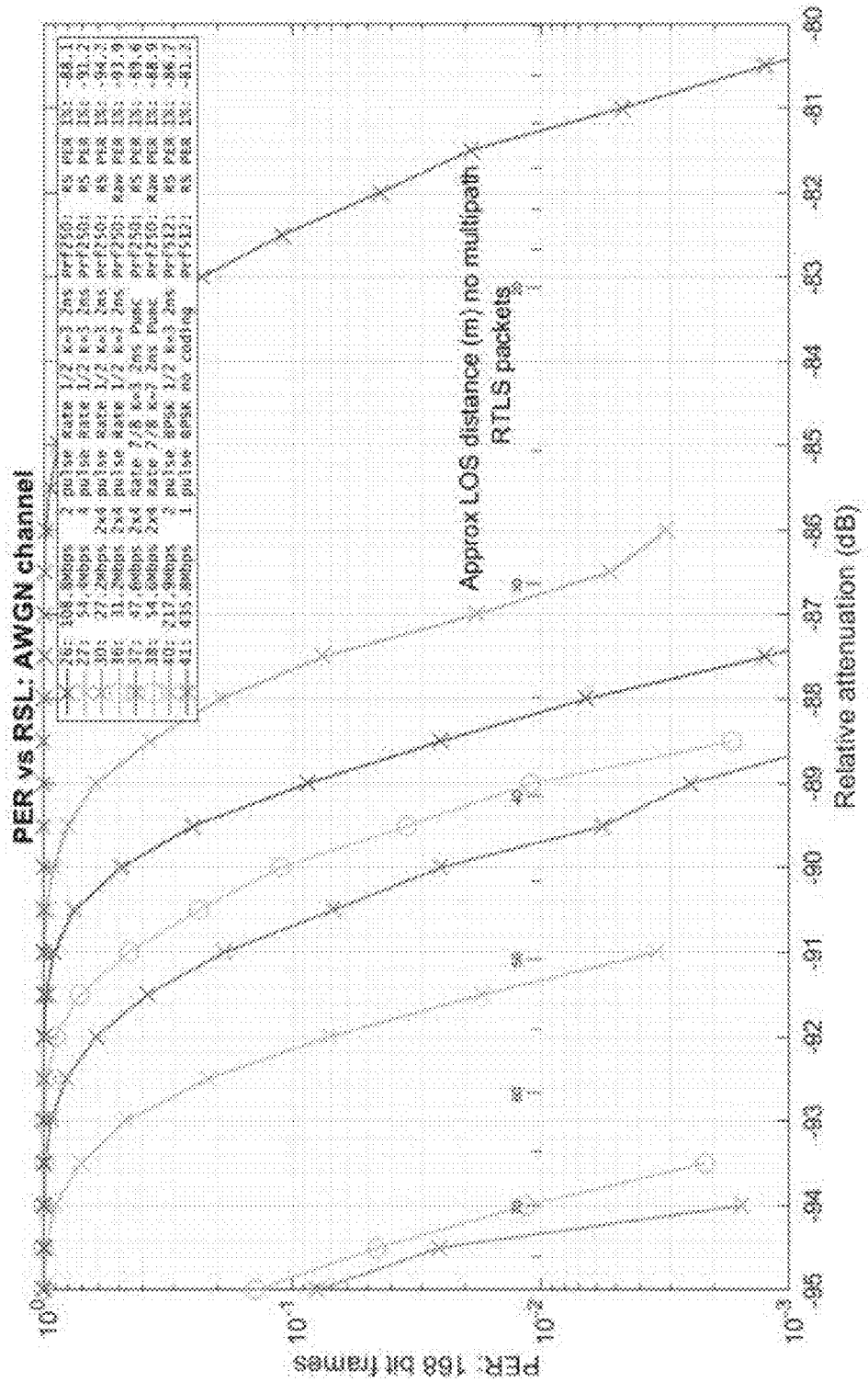
FIG. 5 illustrates, in chart form, simulation results of range versus packet error rate ("PER") in an additive-white-Gaussian-Noise ("AWGN") channel for some embodiments of my method.

I have developed and tested MATLAB simulation models to determine the estimated performance of each of these embodiments, 1.1-1.3 and 2.1-2.3. As can be seen in FIG. 5 performance appears to me to be reasonable for all of these embodiments when operating in a channel that is subject to AWGN. In part, my invention avoids the complexity, in both the transmitter 12 and the receiver 14, that the proposed puncturing schemes will introduce. Further, I can anticipate that my invention will result in at least 2.4 dB better performance. For example, whereas power-per-bit is approximately the same in both schemes, puncturing reduces power-per-bit by approximately 42%, whereas my invention reduces power-per-bit by 50%. Further, as I have noted above, puncturing loses almost of the resulting coding gain.

Figure 6:
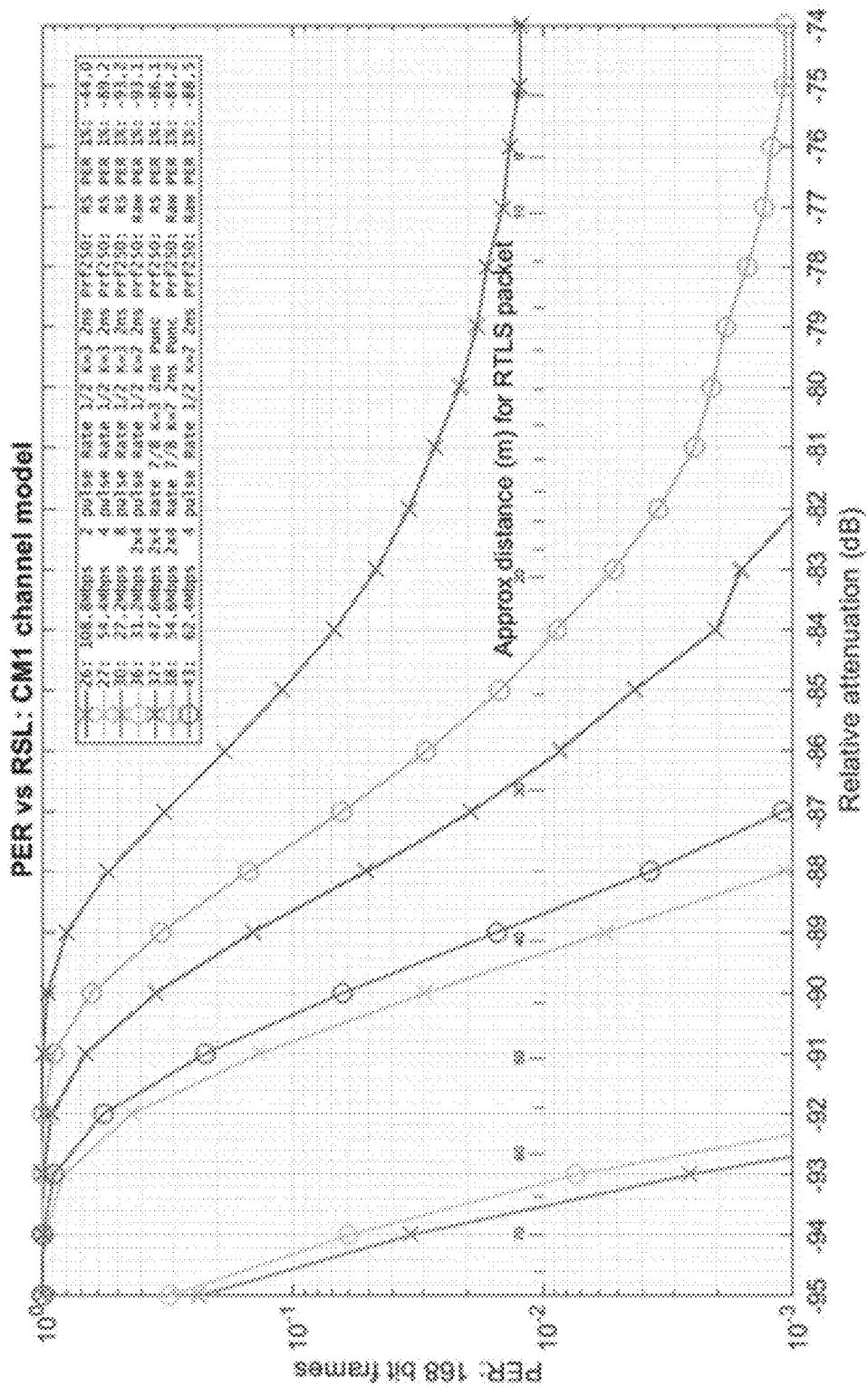
FIG. 6 illustrates, in chart form, simulation results of range versus PER in an IEEE 802.15.4a CM1 multipath channel for some embodiments of my method.

As can be seen in FIG. 6, multipath performance also appears to me to be reasonable for all of these embodiments. By way of contrast, I note that performance hits an error floor for many of the known and proposed schemes: 0.1% for the punctured scheme, 1% for the known 108 Mbps scheme; I anticipate that this trend will continue and will be worse for the proposed 216 Mbps and 435 Mbps schemes; however, short channels with little or no multipath should still be able to use these very high bit rates. Further, using my invention appears to me to offer significantly better performance. For example, from the simulation results shown in FIG. 5, my 54.4 Mbps embodiment appears to be 5.2 dB better (~twice the distance) than the proposed 54.6 Mbps punctured scheme at 1% PER in a multipath channel.

I submit that, while increasing the symbol rate reduces the processing gain, my approach is a better way to increase the bit rate, at least in part because the coding gain does not decrease. As can be seen from the simulation results summarized in my Parent Provisional, my higher symbol rate approach performs better than the puncturing scheme, for approximately the same bit rate. For example, from the simulation results shown in FIG. 5 and FIG. 6, I expect that my invention, configured to operate in a 108 Mbps mode, will achieve a very useful range of 14 m in a multipath channel for a 2% PER, and an excellent 36 meters in an AWGN channel at 1% PER.

One mode in the 4z Standard has a convolutional encoder which convolutionally encodes an input data bit to give 2 coded data bits and maps the 2 coded bits to 8 pulses in a symbol to achieve 27.2 Mbps. In accordance with my invention, I can double the rate to 54.4 Mbps, by simply encoding 2 input bits to 2 pairs of coded bits, and mapping each pair onto (8 divided by 2)=4 pulses. This can be generalized by making the 2 be any power of 2 greater than 1 (which we can call n). The 8 pulses can be any number of pulses, call it m pulses, if m is a multiple of n.

Although I have described my invention in the context of particular embodiments, one of ordinary skill in this art will readily realize that many modifications may be made in such embodiments to adapt either to specific implementations. Further, the several elements described above may be adapted so as to be operable under either hardware or software control or some combination thereof, as is known in this art. Alternatively, the several methods of my invention as disclosed herein in the context of special purpose receiver apparatus may be embodied in computer readable code on a suitable non-transitory computer readable medium such that when a general or special purpose computer processor executes the computer readable code, the processor executes the respective method.

Thus, it is apparent that I have provided an improved UWB method and apparatus having a higher data transmission rate. Although I have so far disclosed my invention only in the context of a packet-based UWB communication system, I appreciate that my invention is broadly applicable to other types of wireless communication systems, whether packed-based or otherwise, that perform channel sounding. Further, I submit that my invention provides performance generally comparable to the best prior art techniques but more efficiently than known implementations of such prior art techniques.

What is claimed is:

1. An apparatus for higher data rate transmission, comprising:
   a convolutional encoder configured to:
      receive an input data bit;
      encode the input data bit to generate two coded data bits, $g_0$ and $g_1$; and
      develop a convolutionally encoded symbol;
   a symbol mapper configured to map the two encoded data bits to a symbol, wherein in a first mode of operation the symbol mapper is configured to:
      map $g_0$ to a first set of 4 pulses in a first symbol;
      insert a first guard interval comprising 4 silent chips in the first symbol;
      map $g_1$ to a second set of 4 pulses in the first symbol; and
      insert a second guard interval comprising 4 silent chips in the first symbol;
   wherein in a second mode of operation the symbol mapper is configured to:
      map $g_0$ to a third set of 2 pulses in a second symbol;
      insert a third guard interval comprising 2 silent chips in the second symbol;
      map $g_1$ to a fourth set of 2 pulses in the second symbol; and
      insert a fourth guard interval comprising 2 silent chips in the second symbol.

2. The apparatus of claim 1, wherein:
   the first mode of operation has a bit rate of 31.2 Mb/s; and
   the second mode of operation has a bit rate of 62.4 Mb/s.

3. The apparatus of claim 1, wherein the symbol mapper is further characterized in that each of the two encoded data bits is selectively mapped to a single pulse of a packet.

4. The apparatus of claim 1, wherein the symbol mapper is further configured to:
   in a selected third mode of operation different from the first and second modes of operation, map the each encoded data bit to a respective pulse of a packet.

5. A method for higher data rate transmission, comprising:
   receive an input data bit;
   encode the input data bit to generate two coded data bits, $g_0$ and $g_1$;
   develop a convolutionally encoded symbol;
   map the two encoded data bits to a symbol in a first mode of operation with a the symbol mapper;
   wherein in the first mode of operation, the method comprises:
      map $g_0$ to a first set of 4 pulses in a first symbol;
      insert a first guard interval comprising 4 silent chips in the first symbol;
      map $g_1$ to a second set of 4 pulses in the first symbol; and
      insert a second guard interval comprising 4 silent chips in the first symbol;
   wherein in a second mode of operation the method comprises:
      map $g_0$ to a third set of 2 pulses in a second symbol;
      insert a third guard interval comprising 2 silent chips in the second symbol;
      map $g_1$ to a fourth set of 2 pulses in the second symbol; and
      insert a fourth guard interval comprising 2 silent chips in the second symbol.

6. The method of claim 5, wherein:
   the first mode of operation has a bit rate of 31.2 Mb/s; and
   the second mode of operation has a bit rate of 62.4 Mb/s.

7. The method of claim 5, wherein each of the two encoded data bits is selectively mapped to a single pulse of a packet.

8. The method of claim 5, in a selected third mode of operation different from the first and second modes of operation, the method further comprises mapping the each encoded data bit to a respective pulse of a packet.

9. An apparatus for higher data rate transmission, comprising:
   a convolutional encoder configured to:
      receive an input data bit;
      encode the input data bit to generate two coded data bits, $g_0$ and $g_1$; and
      develop a convolutionally encoded symbol;
   a symbol mapper configured to map the two encoded data bits to a symbol, wherein in a first mode of operation the symbol mapper is configured to:
      map $g_0$ to a first set of 4 pulses in a first symbol;
      insert a first guard interval comprising 4 silent chips in the first symbol;
      map $g_1$ to a second set of 4 pulses in the first symbol; and
      insert a second guard interval comprising 4 silent chips in the first symbol;
   wherein in a second mode of operation the symbol mapper is configured to:
      map $g_0$ to a third pulse in a second symbol;
      insert a third guard interval comprising one silent chip in the second symbol;
      map $g_1$ to a fourth pulse in the second symbol; and insert a fourth guard interval comprising one silent chip in the second symbol.

10. The apparatus of claim 9, wherein:
the first mode of operation has a bit rate of 31.2 Mb/s; and
the second mode of operation has a bit rate of 124.8 Mb/s.

11. The apparatus of claim 9, wherein the symbol mapper is further characterized in that each of the two encoded data bits is selectively mapped to a single pulse of a packet.

12. The apparatus of claim 9, wherein the symbol mapper is further configured to:
in a selected third mode of operation different from the first and second modes of operation, map the each encoded data bit to a respective pulse of a packet.

13. A method for a higher data rate transmission, comprising:
receiving an input data bit;
encoding the input data bit to generate two coded data bits, $g_0$ and $g_1$;
developing a convolutionally encoded symbol; and
mapping the two encoded data bits to a symbol:
wherein in a first mode of operation the symbol mapper, the method comprises:
mapping $g_0$ to a first set of 4 pulses in a first symbol;
inserting a first guard interval comprising 4 silent chips in the first symbol;
mapping $g_1$ to a second set of 4 pulses in the first symbol; and
inserting a second guard interval comprising 4 silent chips in the first symbol;
wherein, in a second mode of operation, the method comprises:
mapping $g_0$ to a third pulse in a second symbol;
inserting a third guard interval comprising one silent chip in the second symbol;
mapping $g_1$ to a fourth pulse in the second symbol; and
inserting a fourth guard interval comprising one silent chip in the second symbol.

14. The apparatus of claim 13, wherein:
the first mode of operation has a bit rate of 31.2 Mb/s; and
the second mode of operation has a bit rate of 124.8 Mb/s.

15. The apparatus of claim 13, wherein the each encoded data bit is selectively mapped to a single pulse of a packet.

16. The apparatus of claim 13, wherein in a selected third mode of operation different from the first and second modes of operation, the method further comprises mapping the each encoded data bit to a respective pulse of the packet.

* * * * *

UNITED STATES PATENT AND TRADEMARK OFFICE
CERTIFICATE OF CORRECTION

| | | Page 1 of 1 |
|---|---|---|
| PATENT NO. | : 12,237,865 B2 | |
| APPLICATION NO. | : 18/434089 | |
| DATED | : February 25, 2025 | |
| INVENTOR(S) | : Michael McLaughlin | |

It is certified that error appears in the above-identified patent and that said Letters Patent is hereby corrected as shown below:

In the Specification

In Column 3, Line 31, replace "(m+n)" with --(m÷n)--.

In Column 4, Line 27, replace "DO" with --D0--.

Signed and Sealed this
Twenty-fifth Day of March, 2025

Coke Morgan Stewart
*Acting Director of the United States Patent and Trademark Office*